(12) United States Patent
Abiko (10) Patent No.: US 8,363,486 B2
(45) Date of Patent: Jan. 29, 2013

(54) NONVOLATILE SEMICONDUCTOR MEMORY DEVICE

(75) Inventor: Naofumi Abiko, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 12/884,958

(22) Filed: Sep. 17, 2010

(65) Prior Publication Data

US 2011/0141814 A1 Jun. 16, 2011

(30) Foreign Application Priority Data

Dec. 15, 2009 (JP) ................................ 2009-284315

(51) Int. Cl.
*G11C 7/10* (2006.01)

(52) U.S. Cl. ......... 365/189.05; 365/185.17; 365/189.14; 365/189.17; 365/189.18

(58) Field of Classification Search ............. 365/185.17, 365/189.14, 189.17, 189.18, 189.05
See application file for complete search history.

(56) References Cited

U.S. PATENT DOCUMENTS

| 6,650,566 | B2 | 11/2003 | Jeong et al. | |
|---|---|---|---|---|
| 6,807,098 | B2 | 10/2004 | Jeong et al. | |
| 6,891,754 | B2 | 5/2005 | Jeong et al. | |
| 7,239,561 | B2 * | 7/2007 | Park | 365/189.07 |
| 2005/0099848 | A1 * | 5/2005 | Toda | 365/185.17 |
| 2006/0181943 | A1 * | 8/2006 | Kim | 365/200 |
| 2007/0236985 | A1 * | 10/2007 | Edahiro et al. | 365/154 |
| 2008/0080243 | A1 * | 4/2008 | Edahiro et al. | 365/185.11 |

FOREIGN PATENT DOCUMENTS

| JP | 11-186527 | 7/1999 |
|---|---|---|
| JP | 2000-123583 | 4/2000 |
| JP | 2002-203393 | 7/2002 |
| JP | 2009-266349 | 11/2009 |

OTHER PUBLICATIONS

U.S. Appl. No. 13/432,708, filed Mar. 28, 2012, Yoshihara, et al.
U.S. Appl. No. 13/432,465, filed Mar. 28, 2012, filed Yoshihara.

* cited by examiner

*Primary Examiner* — Haoi V Ho
*Assistant Examiner* — Jay Radke
(74) *Attorney, Agent, or Firm* — Oblon, Spivak, McClelland, Maier & Neustadt, L.L.P.

(57) ABSTRACT

According to one embodiment, in a nonvolatile semiconductor memory device, a data latch circuit which is connected to a sense amplifier circuit controls a data writing operation and a data reading operation to and from a nonvolatile memory cell array through a data bus, and outputs the stored data to the data bus when the sense amplifier circuit performs the data writing operation. The data latch circuit is provided with two nodes respectively storing and outputting normal data and reverse data which are connected to the data bus.

17 Claims, 10 Drawing Sheets

|  | E | A | B | C |
|---|---|---|---|---|
| LDL | 1 | 1 | 0 | 0 |
| UDL | 1 | 0 | 0 | 1 |

DATA TRANSFER FROM YBOX TO SENSE AMPLIFIER CIRCUIT
(LOGICAL OPERATION: LDL AND UDL→SENSE AMPLIFIER CIRCUIT)

| LDL | UDL | SA |
|---|---|---|
| 0 | 0 | 0 |
| 1 | 0 | 0 |
| 0 | 1 | 0 |
| 1 | 1 | 1 |

FIG.14

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2009-284315, filed on Dec. 15, 2009; the entire contents of which are incorporated herein by reference.

FIELD

Embodiments described herein relate generally to a nonvolatile semiconductor memory device.

BACKGROUND

A NAND-type flash memory is one of a nonvolatile semiconductor memory device that can record much more information in a small chip, according to a multi-level technology which enables one memory cell transistor of a plurality of NAND strings forming a memory cell array to store the information for two bits or three bits. Together with a widespread use of the NAND-type flash memories for mobile devices handling large capacity data such as image and moving image, their demand is rapidly increasing.

A NAND-type flash memory is provided with a sense amplifier circuit and a data latch circuit in each bit line of a memory cell array, so that a writing operation and a reading operation can be simultaneously performed on a page basis. Here, the sense amplifier circuit is a circuit for controlling the reading operation and the writing operation. The data latch circuit is a circuit for temporarily storing the data read by the sense amplifier circuit from the memory cell, to output the above data externally and temporarily storing the written data input externally, to pass the above data to the sense amplifier.

One page is basically defined as about 2 KB. After reading out the data of about 2 KB, simultaneously the data is externally output in serial, thereby raising the data throughput. By changing the capacity of one writing and reading data from 2 KB to 4 KB in a page basis operation, the writing and reading throughput can be enhanced. At the present, with a page basis of 8 KB, the 16 KB data, double the page, can be simultaneously written and read out.

In a NAND-type flash memory, scale down of a memory cell array is developing, and in order to reduce a chip size, a reduction in the peripheral circuit size also becomes very important. Of the peripheral circuit, as it requires the same number of the sense amplifier circuits and the data latch circuits as the number of pages, the number of the both circuits is huge, occupying 10% of the chip size. In order to reduce the chip size, we have to challenge the size reduction of the sense amplifier circuit and the data latch circuit as well as the miniaturization of a memory cell array.

In this embodiment, a size reduction of the data latch circuit is considered. In this respect, there is posed a challenge to reduce the number of transistors and the size of a transistor itself. When the data latch circuit is scaled down, however, the circuit itself becomes fragile, deteriorating the data keeping ability and an erroneous inversion of the stored data may happen in some cases. Further, currents consumed for data transfer between the data latch circuits and the sense amplifier circuits become a considerable problem from a viewpoint of reducing the current consumption.

DETAILED DESCRIPTION

In general, according to one embodiment, in a nonvolatile semiconductor memory device, a data latch circuit which is connected to a sense amplifier circuit controls a data writing operation and a data reading operation to and from a nonvolatile memory cell array through a data bus, and outputs the stored data to the data bus when the sense amplifier circuit performs the data writing operation. The data latch circuit is provided with two nodes respectively storing and outputting normal data and reverse data which are connected to the data bus.

Exemplary embodiments of a nonvolatile semiconductor memory device including a data latch circuit will be explained below in detail with reference to the accompanying drawings. The present invention is not limited to the following embodiment.

Figure 1:
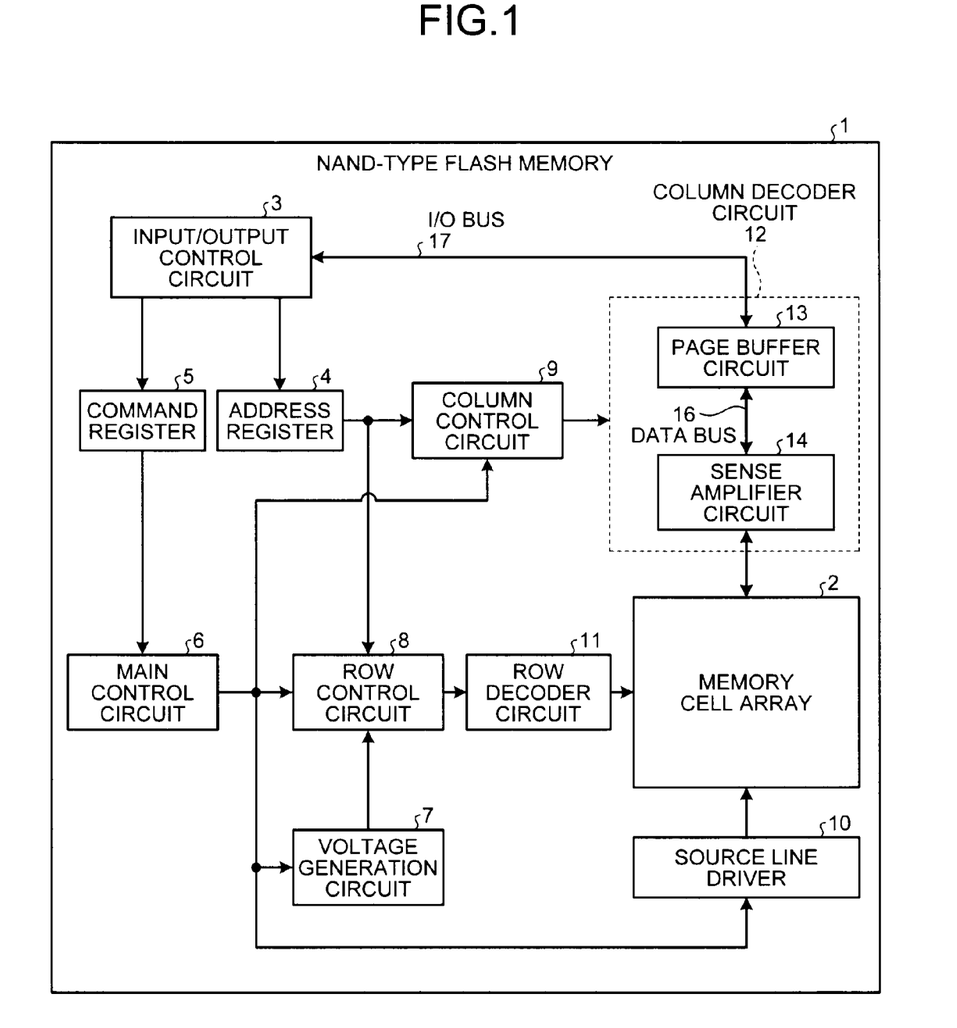
FIG. 1 is a block diagram showing a constitutional example of a nonvolatile semiconductor memory device (NAND-type flash memory) including a data latch circuit according to an embodiment.

FIG. 1 is a block diagram showing a constitutional example of a nonvolatile semiconductor memory device (NAND-type flash memory) including the data latch circuit according to the embodiment. In FIG. 1, a NAND-type flash memory 1 includes a memory cell array 2, an input/output control circuit 3, an address register 4, a command register 5, a main control circuit 6, a voltage generation circuit 7, a row control circuit 8, a column control circuit 9, a source line driver 10, a row decoder circuit 11, and a page buffer circuit 13 and a sense amplifier circuit 14 working as a column decoder circuit 12.

The data latch circuit (FIG. 5) according to the embodiment is provided within the page buffer circuit 13 which intervenes between the input/output control circuit 3 and the sense amplifier circuit 14. The sense amplifier circuit 14 is connected to the page buffer circuit 13 through a data bus 16. The data latch circuit according to the embodiment is constituted in that when write data is transferred to the sense amplifier circuit 14 through the data bus 16 in parallel, the current consumption can be reduced. The page buffer circuit 13 is connected to the input/output control circuit 3 through an I/O bus 17. The I/O bus 17 transfers the read data to be output externally and the write data to be input externally in serial.

At first, the respective elements of the NAND-type flash memory 1 shown in FIG. 1 will be described briefly. The input/output control circuit 3 outputs the read data taken from the I/O bus 17 to the outside. The input/output control circuit 3 receives the write data, address, and command from the outside. The input/output control circuit 3 outputs the write data to the I/O bus 17, sets the address in the address register 4, and sets the command in the command register 5.

The address set in the address register 4 is transferred to the row control circuit 8 and the column control circuit 9. The command set in the command register 5 is transferred to the main control circuit 6. The main control circuit 6 controls the data writing, data reading, and data deleting operations on the memory cell array 2, based on a command input from the command register 5 according to the operation mode. The main control circuit 6 outputs each corresponding instruction depending on each operation mode of the voltage generation circuit 7, the row control circuit 8, the column control circuit 9, and the source line driver 10, in order to realize the above operations.

The voltage generation circuit 7 generates various voltages (write voltage, verify voltage, non-write voltage, read voltage, and the like) ranging from a negative voltage to a positive high voltage and outputs them to the row control circuit 8 according to the indicated operation instruction. The row control circuit 8 passes a row address from the address register 4 to the row decoder circuit 11, to select a word line of the memory cell array 2 and applies a voltage entered from the voltage generation circuit 7 according to the indicated operational instruction to the word line the row decoder circuit 11 selects, to achieve the indicated operation.

The column control circuit 9 passes a column address from the address register 4 to the sense amplifier circuit 14 within the column decoder circuit 12, to select a bit line of the memory cell array 2 and controls the sense amplifier circuit 14 which selects the above bit line and the corresponding page buffer circuit 13 having a one-to-one relationship to the sense amplifier circuit 14, according to the indicated operational instruction. Here, the column control circuit 9 controls precharge/predischarge of the data bus 16, according to the data transfer direction on the data bus 16, to control the input/output operation of the data latch circuit according to the embodiment.

The source line driver 10 controls a voltage to be given to a source line connecting the respective source terminals of a plurality of NAND strings forming the memory cell array 2, according to the indicated operational instruction.

Figure 2:
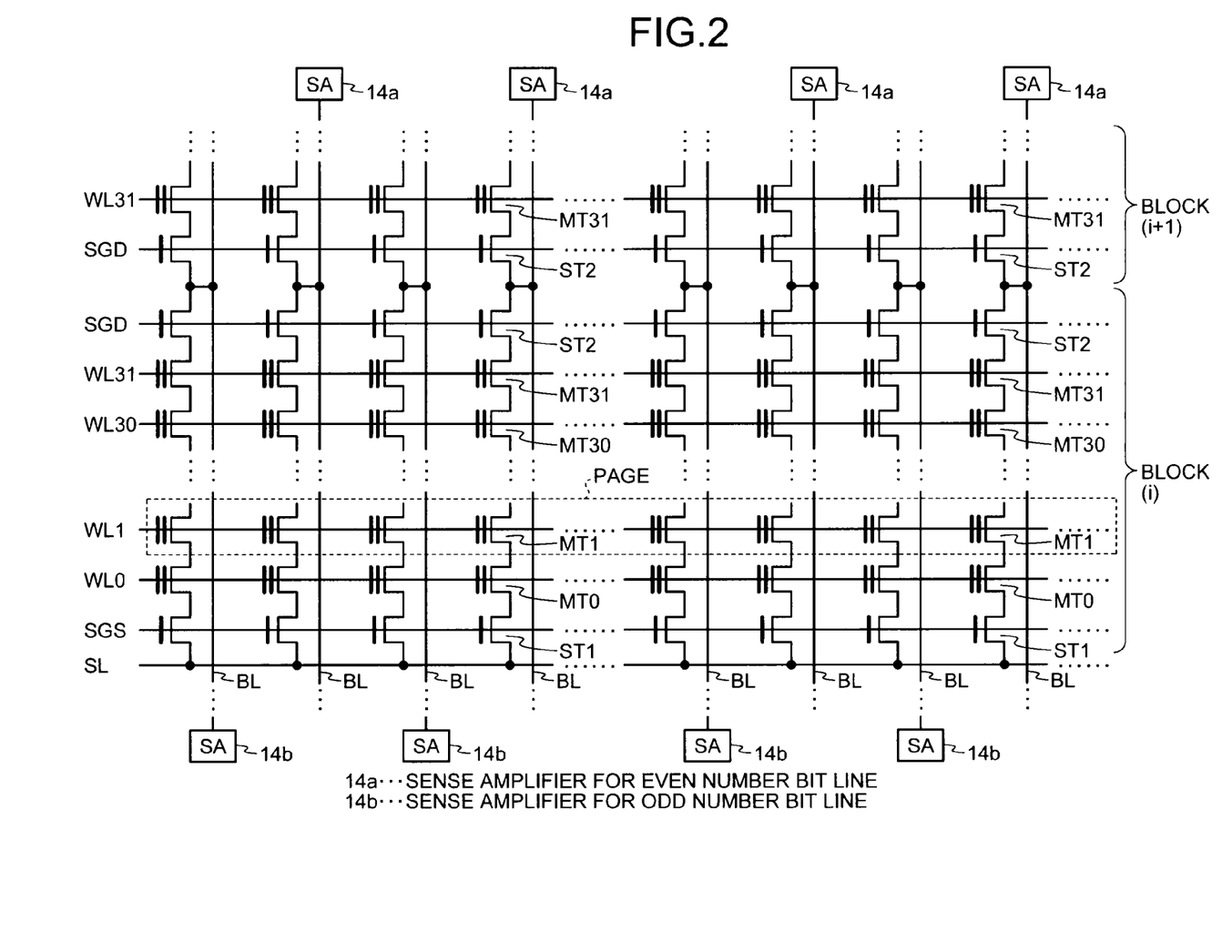
FIG. 2 is a schematic view showing a structure of a memory cell array and a relation to sense amplifier circuits shown in FIG. 1.

FIG. 2 is a schematic view showing the structure of the memory cell array and a relation to the sense amplifier circuit shown in FIG. 1. As illustrated in FIG. 2, the memory cell array 2 includes a plurality of blocks (block (i), block (i+1), . . . ) stacked in an extending direction of the bit line BL. Here, each block is the unit of data delete.

As illustrated in the block (i), each block is formed by the unit of a NAND string, with one end (on the side of the memory cell transistor MT0 in the illustrated example) of a series circuit of a plurality of memory cell transistors MT (32 from MT0 to MT31 in the example of FIG. 2), which are serially connected together in an extending direction of the bit line BL in a way of sharing the diffusion area (source region or drain region), connected to the drain terminal of the select transistor ST1 and the other end (on the side of the memory cell transistor MT31 in the illustrated example) connected to the drain terminal of the select transistor ST2, and each block is formed by arranging this NAND string in every bit line BL.

The memory cell transistor MT has a floating gate whose threshold voltage fluctuates depending on the number of injected electrons and records the corresponding data according to a difference of the threshold voltage. Making use of this point, the memory cell transistor MT can store a so-called multi-level by forming the two states or more having different threshold voltages. In this embodiment, the memory cell transistor MT is designed to store 2 bits (4 values).

In each NAND string in the block (i), the source terminal of the select transistor ST1 is connected to the source line SL. A voltage corresponding to the operation mode is applied to the source line SL from the source line driver 10. The drain terminal of the select transistor ST2 is connected to the corresponding bit line BL, together with the drain terminal of the select transistor ST2 in the block (i+1). The respective gate terminals of the select transistors ST1 and ST2 are, in parallel, connected to the select gate lines SGS and SGD which are connected to the row decoder circuit 11. Namely, the select transistors ST1 and ST2 are individually turned on/off by the row decoder circuit 11 according to the operation mode.

The respective gate terminals of the 32 memory cell transistors MT0 to MT31 connected in series are connected to the respectively corresponding word lines WL0 to WL31 connected to the row decoder circuit 11 in parallel. Here, one page consists of all the memory cell transistors MT having the gate terminals connected to one word line WL in parallel, as illustrated in FIG. 2. Here, the number of the memory cell transistors MT connected to one word line WL means a page length. The page length is various depending on the capacity of the semiconductor chip such as 2 KB, 4 KB, 8 KB and so on.

With the advance in miniaturization of the memory cell array 2, the intervals of the bit lines BL get narrower and it is difficult to arrange all the sense amplifier circuits 14 collectively on each one end of the bit lines BL in a one-to-one correspondence. In this embodiment, as illustrated in FIG. 2, the sense amplifier circuits 14 are classified into the sense amplifier circuits (SA) 14a for even number bit lines and the sense amplifier circuits (SA) 14b for odd number bit lines; the sense amplifier circuits (SA) 14a are provided on the respective one ends of the bit lines BL and the sense amplifier circuits (SA) 14b are provided on the other ends of the bit lines BL. The page buffer circuits 13 are classified into the two types of being connected to the sense amplifier circuits (SA) 14a and being connected to the sense amplifier circuits (SA) 14b. This structure in which one sense amplifier circuit is provided in one bit line is referred to as ABL (All bit Line). Alternatively, there is the structure in which the sense amplifier circuits are provided on one ends of the bit lines and the adjacent bit lines of even number and odd number are connected to each one sense amplifier.

The operation of the NAND-type flash memory 1 having the above structure will be described briefly. At the input of write data, the write data is transferred from the input/output control circuit 3 to the page buffer circuits 13 through the I/O bus 17 in serial and stored in the page buffer circuits 13 temporarily. When all the write data for one page is stored in the page buffer circuits 13, the write data for one page is collectively transferred from the page buffer circuits 13 to the sense amplifier circuits 14 through the data bus 16. Then, the write/non-write data is transferred from the sense amplifier circuits 14 to the bit lines BL of the memory cell array 2 and the writing operation is performed.

At the output of read data, one page data is read out from the memory cell array into the sense amplifier circuits 14, collectively transferred to the page buffer circuits 13 through the data bus 16, and temporarily stored in the page buffer circuits 13. Then, the read data is transferred from the page buffer circuits 13 to the input/output control circuit 3 through the I/O bus 17 in serial.

Figure 3:
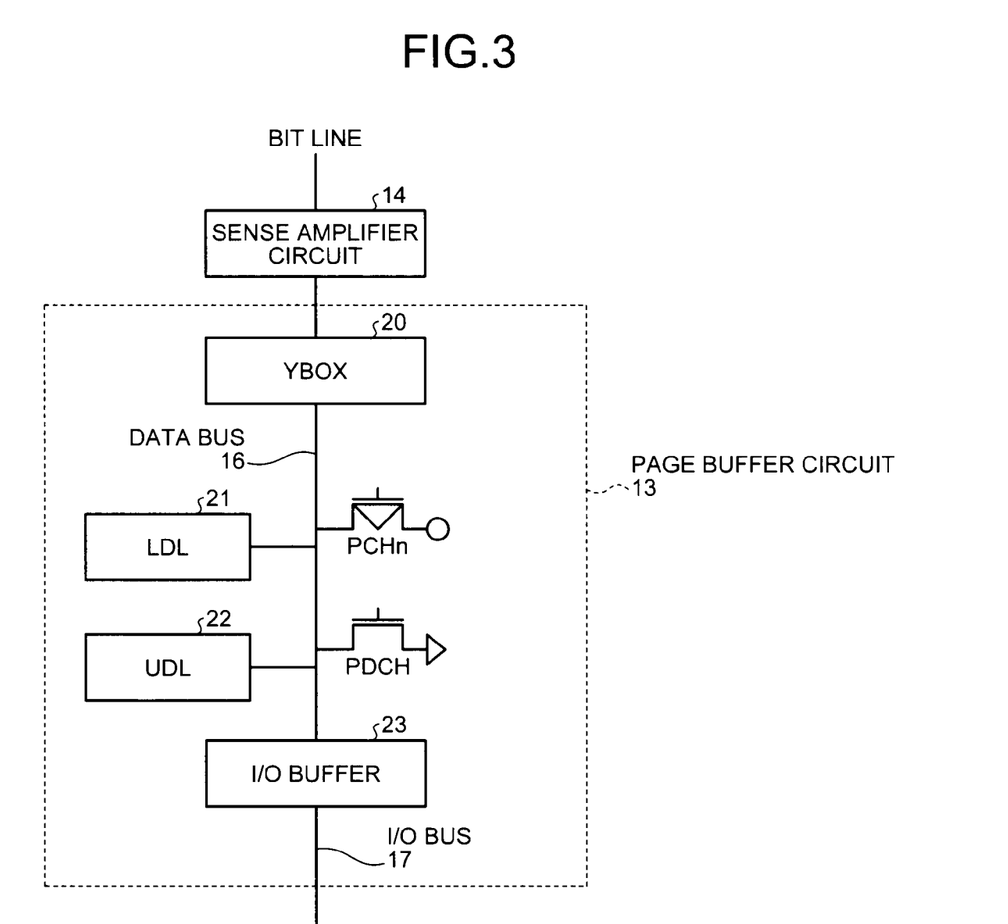
FIG. 3 is a block diagram showing a basic constitutional example of a page buffer circuit shown in FIG. 1.

FIG. 3 is a block diagram showing a basic constitutional example of the page buffer circuit shown in FIG. 1. FIG. 3 shows the structure in the case where the memory cell transistor MT shown in FIG. 2 can store 2 bits (4 values).

In FIG. 3, the page buffer circuit 13 is provided with a YBOX 20, an LDL 21, a UDL 22, and an I/O buffer 23 mutually connected through the data bus 16. The YBOX 20 is provided at one end of the data bus 16 on the side of the sense amplifier circuit 14 in a way of intervening between the sense amplifier circuit 14 and the page buffer circuit 13. The LDL 21 and the UDL 22 are respectively connected to the data bus 16 in parallel. The I/O buffer 23 is provided at the other end of the data bus 16 in a way of intervening between the above end and one end of the I/O bus 17. The data bus 16 is provided with a PMOS transistor PCHn for precharging the data bus 16 to VDD (power voltage) and an NMOS transistor PDCH for predischarging the data bus 16 to 0 V. The YBOX 20, the PMOS transistor PCHn, the NMOS transistor PDCH are respectively controlled by the column control circuit 9 according to the operation mode.

Figure 5:
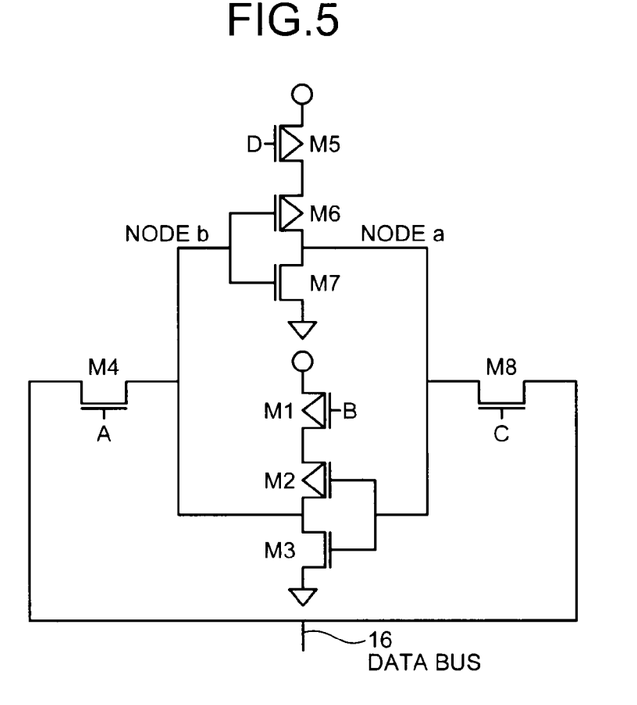
FIG. 5 is a circuit diagram specifically showing a constitutional example of the data latch circuit according to the embodiment, which is used for LDL and UDL in the page buffer circuit shown in FIG. 3.

The LDL 21 is a data latch circuit for temporarily storing the lower bit data of the 2 bit data. The UDL 22 is a data latch circuit for temporarily storing the upper bit data of the 2 bit data. The LDL 21 and the UDL 22 have the same structure and in this embodiment, the structure is as shown in FIG. 5.

The YBOX 20 is a transfer control circuit for controlling a data transfer between the input/output control circuit 3 and the sense amplifier circuit 14: (1) it divides the write data transferred from the I/O buffer 23 to the data bus 16 into the LDL 21 and the UDL 22, where the data is temporarily stored, executes the logical operation AND/OR on the lower bit data stored by the LDL 21 and the upper bit data stored by the UDL 22, and transfers the operation data to the sense amplifier circuit 14, (2) it divides the read data received from the sense amplifier circuit 14 through the data bus 16 into the LDL 21 and the UDL 22, where the data is temporarily stored, and transfers the stored data to the I/O buffer 23 through the data bus 16.

Figure 4:
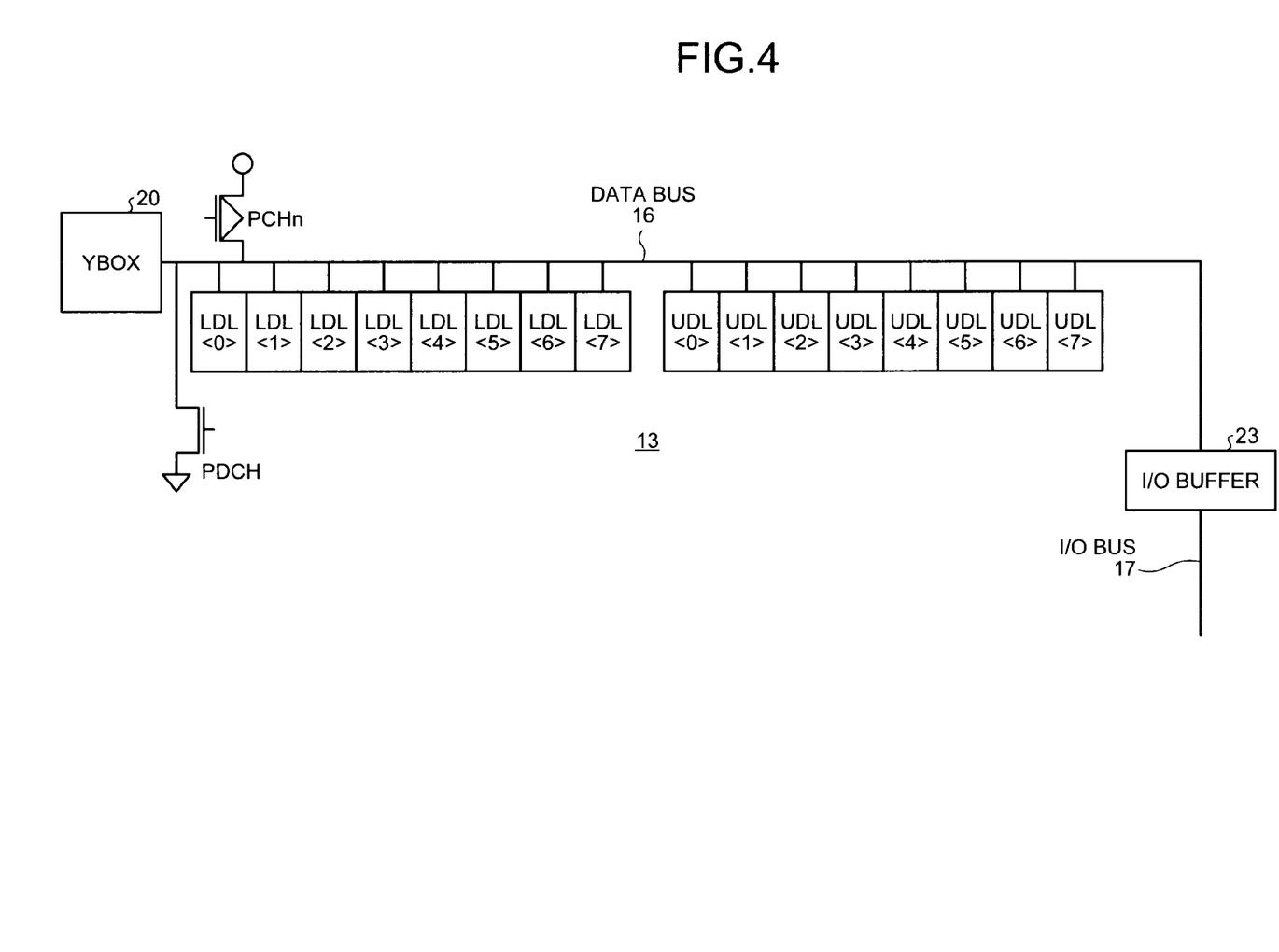
FIG. 4 is a block diagram specifically showing a constitutional example of the page buffer circuit shown in FIG. 3.

FIG. 4 is a block diagram showing the constitutional example of the page buffer circuit shown in FIG. 3. In this embodiment, in order to reduce the circuit size of the whole page buffer circuits, one YBOX 20 and one I/O buffer 23 are prepared for every 8 bits. Namely, as illustrated in FIG. 4, one page buffer circuit 13 has such a structure that eight LDLs and eight UDLs are connected in parallel to the data bus 16 connecting between one YBOX 20 and one I/O buffer 23. Thus constituted page buffer circuits 13 respectively exist correspondingly to the sense amplifier circuits 14 in a one-to-one relationship with the respective bit lines for one page.

The detailed description on the part related to the embodiment will be described hereinafter. FIG. 5 is a circuit diagram showing the constitutional example of the data latch circuit according the embodiment, which is used as the LDL and the UDL in the page buffer circuit shown in FIG. 3. The data latch circuit shown in FIG. 5 is of an SRAM type connecting the input terminal (common gate terminal) and the output terminal (common drain terminal) of two CMOS inverter circuits in a crossing way.

More specifically, the common gate terminal of the PMOS transistor M6 and the NMOS transistor M7 which form one CMOS inverter circuit is connected to the common drain terminal of the PMOS transistor M2 and the NMOS transistor M3 which form the other CMOS inverter circuit. Further, the common gate terminal of the PMOS transistor M2 and the NMOS transistor M3 is connected to the common drain terminal of the PMOS transistor M6 and the NMOS transistor M7.

In one CMOS inverter circuit, the source terminal of the PMOS transistor M6 is connected to the power source through the PMOS transistor M5 and the source terminal of the NMOS transistor M7 is connected to the ground. The PMOS transistor M5 is controlled on/off by a gate control signal D. In the other CMOS inverter circuit, the source terminal of the PMOS transistor M2 is connected to the power source through the PMOS transistor M1 and the source terminal of the NMOS transistor M3 is connected to the ground. The PMOS transistor M1 is controlled on/off by a gate control signal B.

The common drain terminal of the PMOS transistor M6 and the NMOS transistor M7 forms one node as a node a. The node a is connected to the data bus 16 through the NMOS transistor M8. The NMOS transistor M8 is controlled on/off by a gate control signal C. The common drain terminal of the PMOS transistor M2 and the NMOS transistor M3 forms the other node as a node b. The node b is connected to the data bus 16 through the NMOS transistor M4. The NMOS transistor M4 is controlled on/off by a gate control signal A.

These gate control signals A, B, C, and D are respectively output from the column control circuit 9 according to the operation mode. When the node a=VDD, the stored data of the node a is the logical value "1", while when the node a=0 V, the stored data of the node a is the logical value "0". It is the same as for the node b which stores the complementary data.

Figure 6:
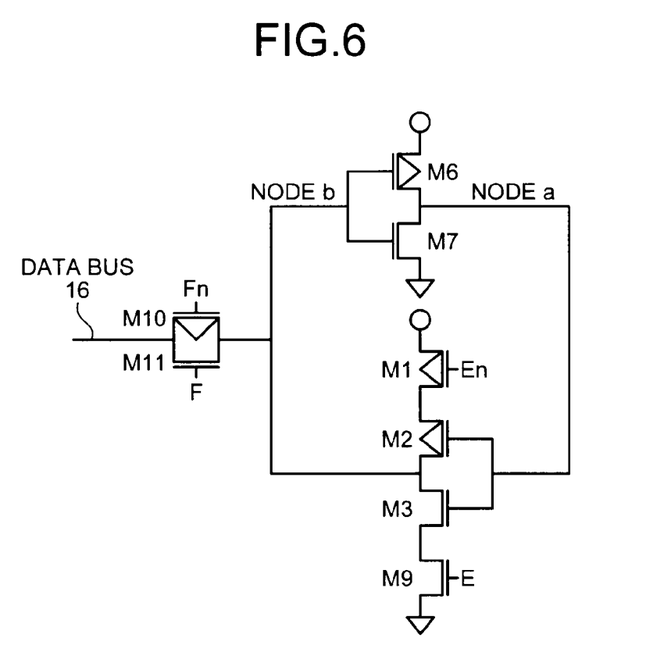
FIG. 6 is a circuit diagram of the data latch circuit shown as a comparative example.
Figure 7:
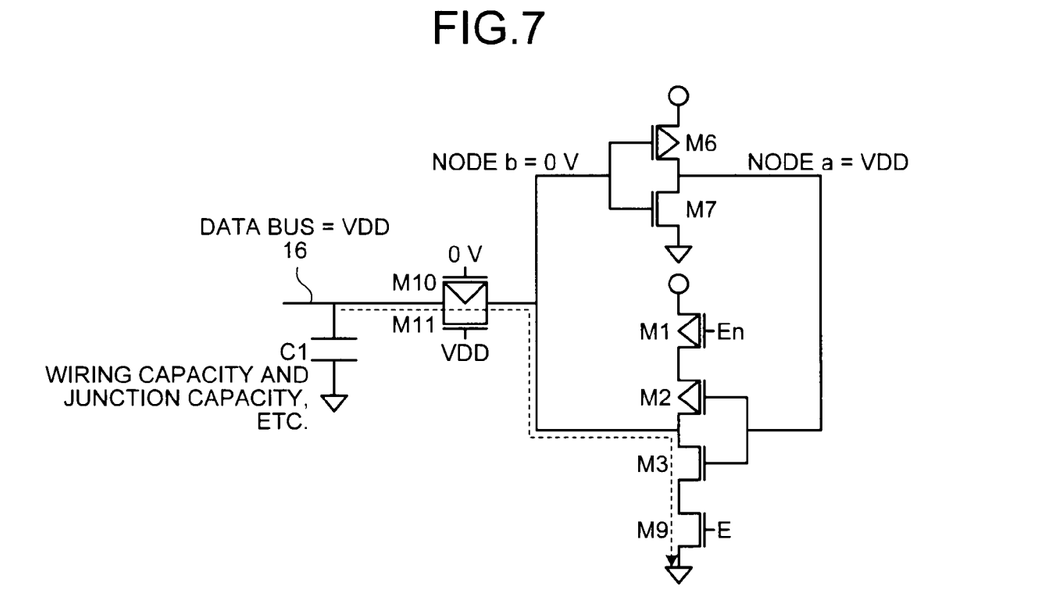
FIG. 7 is a view for explaining the process (No. 1) of generating erroneous reverse data in the data latch circuit of the comparative example shown in FIG. 6.
Figure 8:
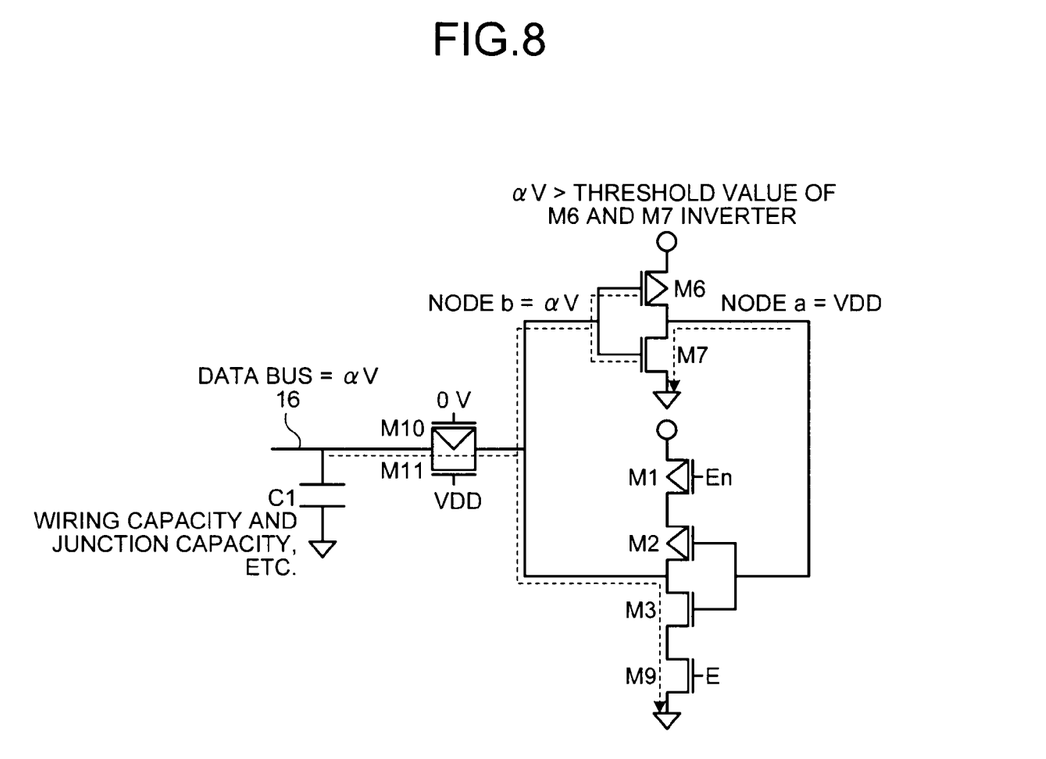
FIG. 8 is a view for explaining the process (No. 2) of generating erroneous reverse data in the data latch circuit of the comparative example shown in FIG. 6.
Figure 9:
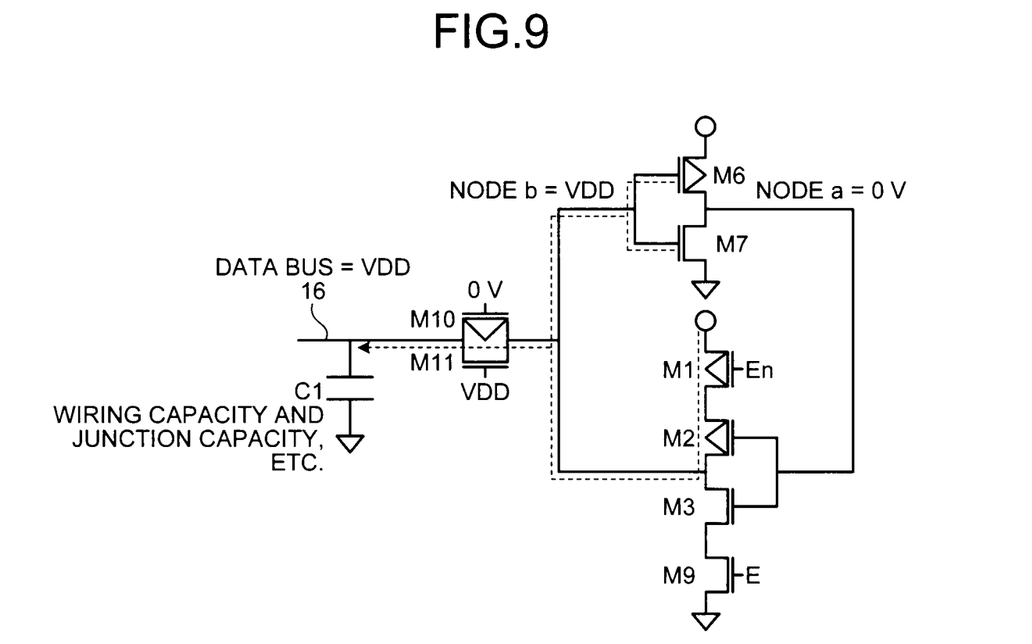
FIG. 9 is a view for explaining the process (No. 3) of generating erroneous reverse data in the data latch circuit of the comparative example shown in FIG. 6.

Before describing the operation of the data latch circuit thus constituted according to the embodiment, the problem to be solved by the invention will be specifically described with reference to a comparative example (FIG. 6 to FIG. 9) for the sake of easy understanding. FIG. 6 is a circuit diagram of the data latch circuit shown as the comparative example. FIG. 7 is a view for explaining the process (No. 1) of generating erroneous reverse data in the data latch circuit of the comparative example shown in FIG. 6. FIG. 8 is a view for explaining the process (No. 2) of generating erroneous reverse data in the data latch circuit of the comparative example shown in FIG. 6. FIG. 9 is a view for explaining the process (No. 3) of generating erroneous reverse data in the data latch circuit of the comparative example shown in FIG. 6.

In the data latch circuit of the comparative example shown in FIG. 6, the PMOS transistor M5 is omitted from the structure shown in FIG. 5, the source terminal of the PMOS transistor M6 is directly connected to the power source, an NMOS transistor M9 is connected between the source terminal of the NMOS transistor M3 and the ground, and the NMOS transistor M9 and the PMOS transistor M1 are controlled on/off by the complementary gate control signals E and En. Further, the node b is connected to the data bus 16 through a transfer gate with the NMOS transistor Mil and the PMOS transistor M10 connected in parallel, which are controlled on/off by the complementary gate control signals F and Fn. The node a is not connected to the data bus 16.

The data latch circuit of the comparative example shown in FIG. 6 includes eight transistors in total: four PMOS transistors and four NMOS transistors, in order to reduce the circuit size, and the channel width of each transistor is defined as 1 µm or less.

In the case of the input from the data bus 16, the PMOS transistor M1 and the NMOS transistor M9 are provided in order to inhibit the current from going from the data bus 16 to the power source and the ground; therefore, when the number of the transistors gets less than this, the current inevitably flows there at the data input and from the viewpoint of low power consumption, a reduction in the number of the transistors is not preferable.

In this regard, a further reduction in the channel width becomes important for the reduction of the circuit size. However, when the data latch circuit is scaled down, it becomes fragile and works unstably. Especially, a possibility of erroneous inversion of the stored data is increasing along with the advance in miniaturization. The state of generating the erroneous inversion is shown in FIG. 7 to FIG. 9.

For example, as illustrated in FIG. 7, the case where 0 V is output to the data bus 16 with the node a of VDD and the node b of 0 V, is considered. As indicated by a capacitor C1, the data bus 16 has a wiring capacitance and a junction capacitance, which is a considerable amount of capacitance.

When the PMOS transistor M10 and the NMOS transistor M11 are turned on at the same time when the data bus 16 is in a state of VDD, the NMOS transistors M3 and M9 extract electric charges of the data bus 16 and the discharge current flows as indicated by a dotted line. However, since the driving power of the data latch circuit gets smaller according to the miniaturization, a discharging speed of the electric charges of the data bus is slow. Therefore, a considerable charge share happens between there and the data bus 16 having the capacitor C1.

Therefore, as illustrated in FIG. 8, when the potential of the node b gets to a higher voltage α V than the inverter threshold potential of the PMOS transistor M6 and the NMOS transistor M7 with the charge share with the data bus 16, the node a is discharged to 0 V through the NMOS transistor M7 which is turned on and the stored data may be erroneously inverted, as illustrated in FIG. 9.

In the data latch circuit of the comparative example shown in FIG. 6, the number of the transistors is reduced to eight and in order to prevent from the erroneous inversion, the size of each transistor is adjusted. In this situation, a transistor having the minimum channel width and channel length which can be used for each generation process cannot be used, thereby hindering a reduction in the circuit size.

Further, in the NAND-type flash memory, a reduction in the power consumption is important. Since it includes numerous data latch circuits and sense amplifier circuits, the current consumed for a data transfer between the data latch circuits and the sense amplifier circuits is huge. Of the current consumed for the data transfer, the current to charge/discharge the data bus 16 is the largest.

At the data transfer to the sense amplifier, at first the data bus 16 is precharged and then the data of the data latch circuit is output to the data bus 16; however, in the data latch circuit of the comparative example shown in FIG. 6, the data bus 16 is connected to the node b and when the node b=0 V, the data bus 16 is discharged through the NMOS transistors M3 and M4.

Figure 14:
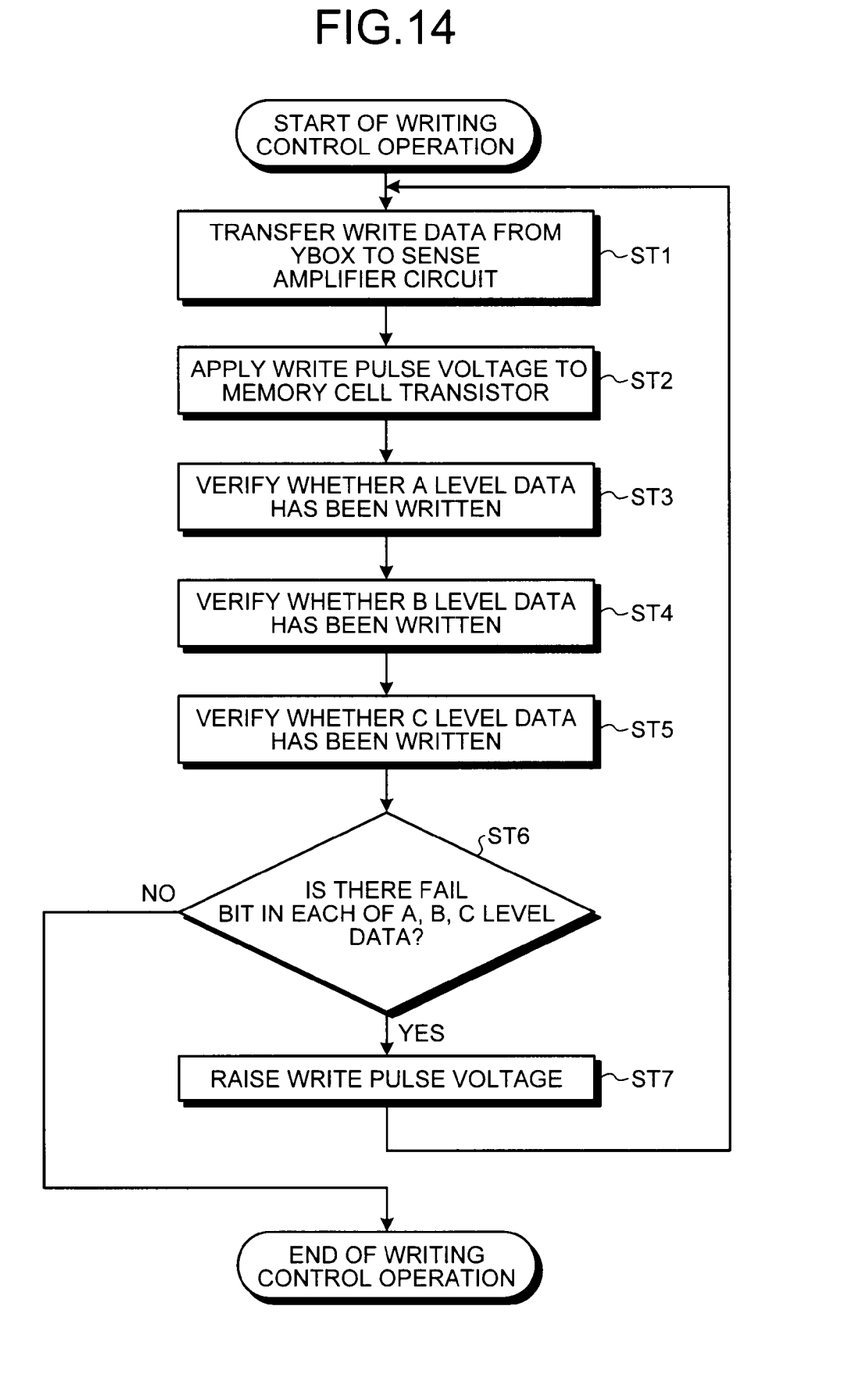
FIG. 14 is a flow chart for explaining the basic sequence of a writing control operation into the memory cell array of the NAND-type flash memory shown in FIG. 1.

In the case of a writing operation, since the writing operation is controlled according to the sequence as shown in FIG. 14, the stored data of the data latch circuit is changing into the writing completion data in the course of writing. Here, when the data showing the writing completion is assigned in the case of the node b=0 V (refer to FIG. 12B), charge and discharge of the data bus 16 is increased and the current consumption is increased in some cases.

The data latch circuit according to the embodiment shown in FIG. 5 is designed to be able to prevent the erroneous inversion when the data is output to the data bus and to reduce the data bus charge and discharge current at an input and output to and from the data bus, by using a transistor of the minimum size that can be used for each generation process, with the same number of the transistors as that in the data latch circuit of the comparative example shown in FIG. 6.

As is known from the comparison with FIG. 6, it is characterized in that the two nodes are both connected to the data bus and that only the NMOS transistors are used for a connection to the data bus. Hereinafter, the operation about the portion related to the embodiment will be described with reference to FIG. 10 to FIG. 14.

Figure 10:
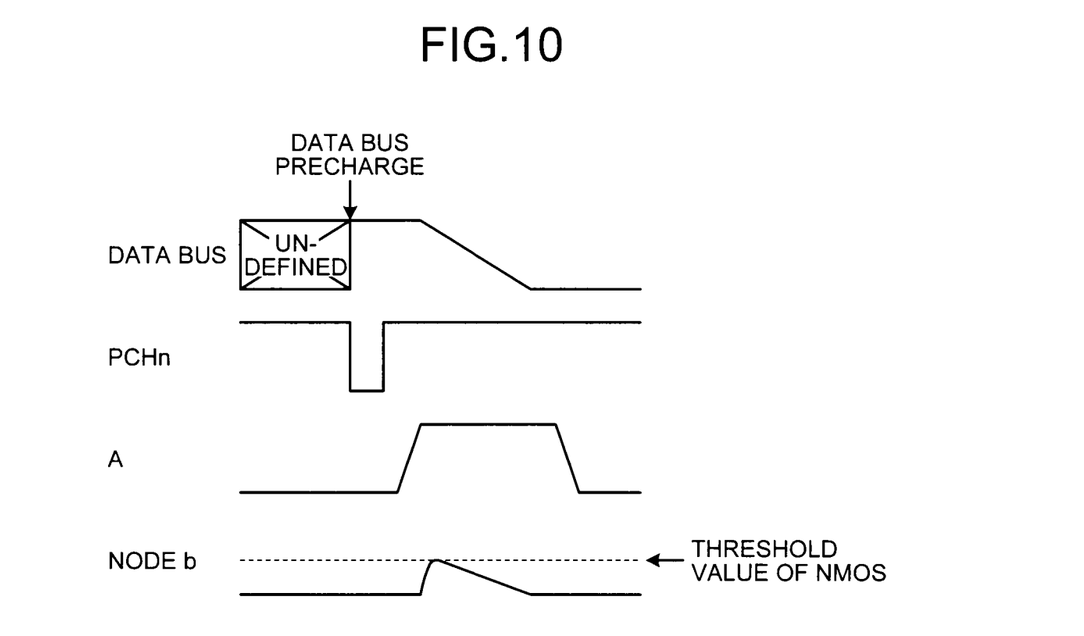
FIG. 10 is a timing chart for explaining the operation when data is output from the data latch circuit according to the embodiment shown in FIG. 5 to a data bus.
Figure 11:
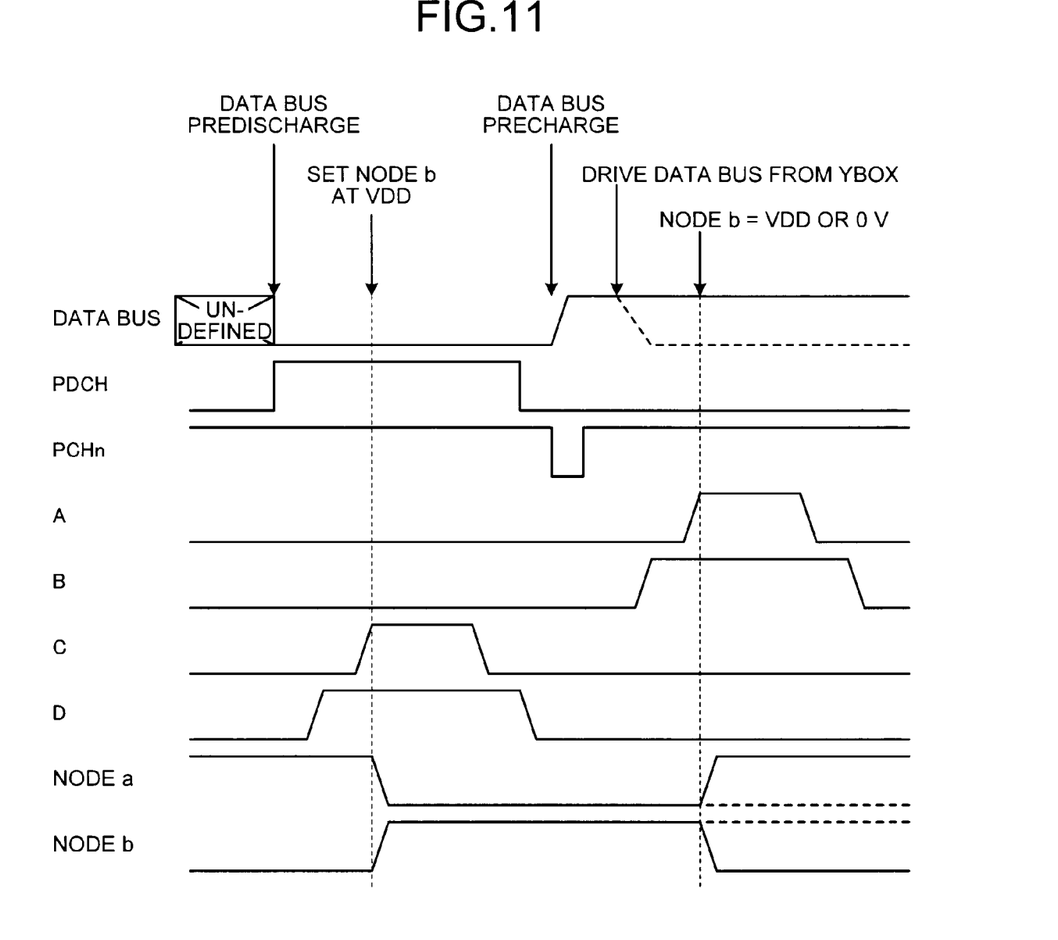
FIG. 11 is a timing chart for explaining the operation when data is input from the data bus to the data latch circuit according to the embodiment shown in FIG. 5.
Figure 12A:
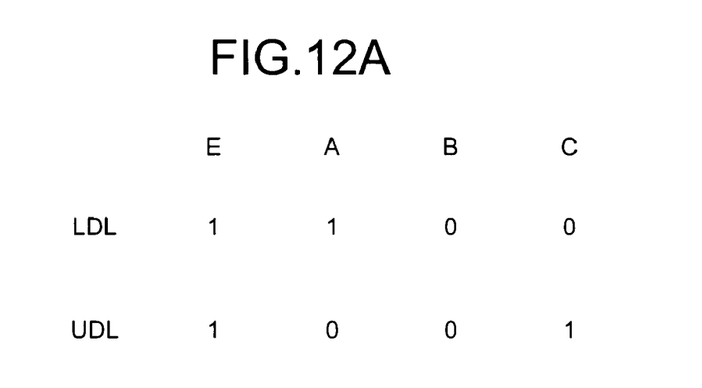
FIGS. 12A and 12B are views showing a data assignment example of the LDL and the UDL in the page buffer circuit shown in FIG. 3 and a data assignment example by the threshold value of the memory cell transistor.
Figure 12B:
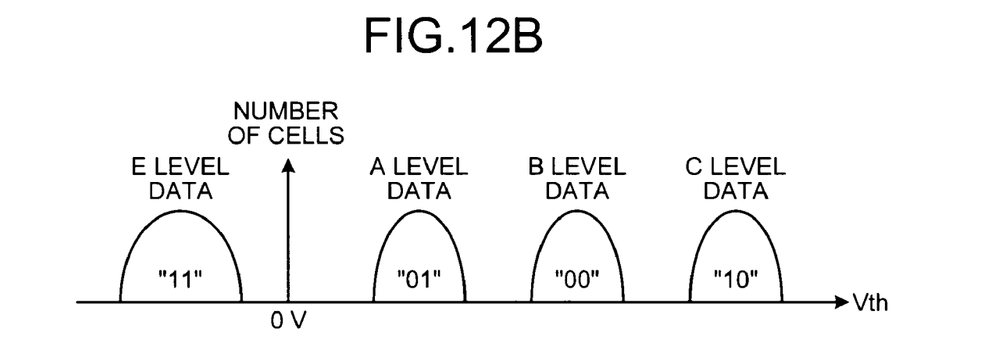
Figure 13:
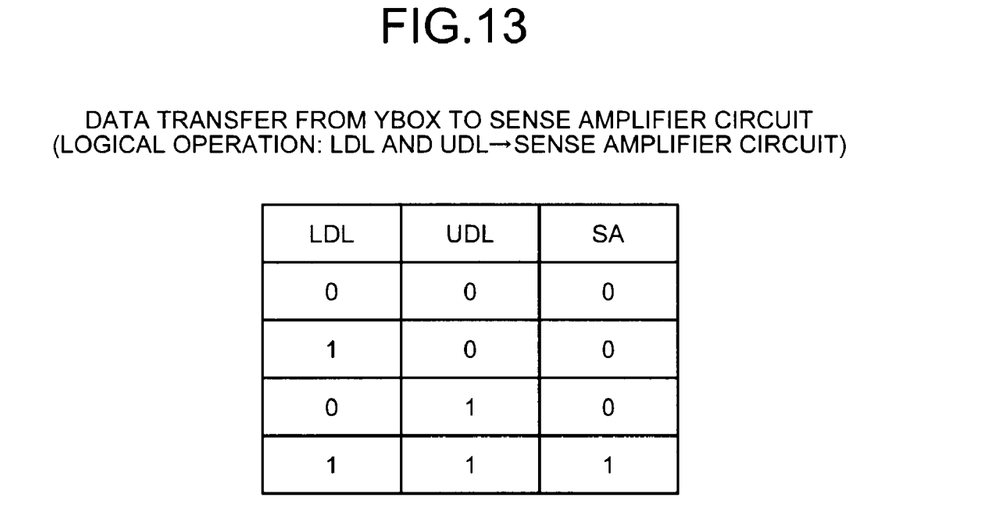
FIG. 13 is a view for explaining the operation when the YBOX of the page buffer circuit shown in FIG. 3 transfers data to the sense amplifier.

FIG. 10 is a timing chart for explaining the operation in the case of outputting data from the data latch circuit according to the embodiment shown in FIG. 5 to the data bus. FIG. 11 is a timing chart for explaining the operation in the case of inputting data from the data bus to the data latch circuit according to the embodiment shown in FIG. 5. FIGS. 12A and 12B are views indicating a data assignment example of the LDL and the UDL in the page buffer circuit shown in FIG. 3 and a data assignment example by the threshold value of the memory cell transistor. FIG. 13 is a view for explaining the operation when the YBOX of the page buffer circuit shown in FIG. 3 transfers data to the sense amplifier. FIG. 14 is a flow chart for explaining the basic sequence of a writing control operation into the memory cell array of the NAND-type flash memory shown in FIG. 1.

FIG. 10 shows the case of outputting the stored data "0" at the node b=0 V to the data bus 16. In this case, since the node a is VDD, the NMOS transistor M3 is turned on. At first, the data bus 16 in an undefined initial state is precharged by the PMOS transistor PCHn for precharge to VDD. Next, when the gate control signal A is raised up to a high level (VDD), to turn on the NMOS transistor M4, the data bus 16 is discharged to 0 V through the NMOS transistors M4 and M3. When the data bus 16 is fully discharged to 0 V, the YBOX 20 takes in the data "0" of the data bus 16.

The same procedure is performed also in the case of outputting the stored data "0" at the node a=0 V to the data bus 16. The gate control signal C is raised up to a high level (VDD) to turn on the NMOS transistor M8, and the data bus 16 is discharged to 0 V through the NMOS transistor M7.

Here, since the data bus 16 and the nodes a and b are connected only to the NMOS transistors M8 and M4, electric charge of the data bus 16 flows into the node a or the node b; even when the potential of the node a or the node b rises up, it will never rise up to more than the threshold value of the NMOS transistors M8 and M4. Namely, the stored data will never be erroneously inverted, which is different from the data latch circuit of the comparative example.

Since it is not necessary to adjust the transistor size in order to prevent an erroneous inversion, a transistor of the minimum size that can be used for each generation process can be used, hence to reduce the circuit size. Further, it is possible to omit the PMOS transistors M5 and M1 and also, in this respect, the circuit size can be reduced.

A path for discharging the data bus 16 becomes the NMOS transistor M7 when the stored data of the node a is output, and when the stored data of the node b is output, it becomes the NMOS transistor M3; compared with the path of the NMOS transistors M3 and M9 in two series in the data latch circuit of the comparative example, a discharge speed is faster. Namely, the effect which the capacitor C1 imposed on the data bus 16 has on the driving force of the data latch circuit is less than that in the case of the data latch circuit of the comparative example. In this respect, the structure shown in FIG. 5 can prevent the generation of the erroneous inversion effectively.

Further, the stored data in both the node a and the node b can be output to the data bus 16, and therefore, by controlling to output the stored data from the node having the less number of discharge times of the data bus 16, an extra discharge operation of the data bus 16 can be avoided and the current consumption at the next precharge can be reduced.

FIG. 11 shows the case of inputting the data "1" or the data "0" from the data bus 16 to the node b. Since a connection with the data bus 16 is performed only by the NMOS transistors M4 and M8, it is not possible to charge the node a and the node b from the data bus 16 directly to VDD. In the case of inputting the data from the data bus 16, for example, to the node b, the procedure as shown in FIG. 11 is taken.

The data bus 16 in an undefined initial state is discharged by the NMOS transistor PDCH for predischarge to 0V. When it is fully discharged, the gate control signal D is raised up to a high level (VDD), to turn off the PMOS transistor M5. Then, the gate control signal C is raised up to a high level (VDD), to turn on the NMOS transistor M8, and the node a is connected to the data bus 16 and discharged to 0 V. Since the PMOS transistor M1 is on by the gate control signal B that is a low level (0 V), the node b is set at VDD.

Next, the gate control signals D and C are raised up to a low level (0 V) in this order, the NMOS transistor PDCH for predischarge is turned off, and the data bus 16 is charged to VDD by the PMOS transistor PCHn for precharge. Then, the data "1" or the data "0" is output from the YBOX 20 to the data bus 16. When the output data of the YBOX 20 is the logical value "1", the data bus 16 remains at VDD as indicated by the solid line. When the output data of the YBOX 20 is the logical value "0", the data bus 16 is discharged to 0 V as indicated by the dotted line.

In this state, the gate control signals B and A are raised up to a high level (VDD) in this order, VDD or 0 V of the data bus 16 is applied to the node b through the NMOS transistor M4. The node b remains at VDD (dotted line) or discharged to 0 V (solid line). Since the PMOS transistor M5 is turned on by the gate control signal D of a low level, the node a becomes 0 V (dotted line) or VDD (solid line).

Next, the data assignment of the LDL and the UDL that are the data latch circuits will be described. FIG. 12B shows the data assignment example in the threshold distribution when the memory cell transistor MT can store 2 bit data (4 values). The E level data "11" in a delete state is assigned to the negative threshold distribution and the A level data "01", the B level data "00", and the C level data "10" are assigned to the positive threshold distribution in this order from the lower threshold Vth to the higher one. The stored data of the LDL and the UDL provided in every column is assigned in a one-to-one correspondence, as illustrated in FIG. 12A. Here, the data "1" and "0" in the LDL and the UDL indicates the stored data of the node a.

The writing into the memory cell transistor MT is performed on a page basis in the procedure shown in FIG. 14. When the writing of each level data is completed as the result of verify in the course of the writing, the stored data of the corresponding LDL and UDL is rewritten into the logical value "1". Namely, the completion of the writing means that the stored data of the LDL and the UDL becomes all the logical value "1".

Next, in the case of the data transfer from the YBOX 20 to the sense amplifier circuit 14, a logical operation (AND operation) of the LDL&UDL as shown in FIG. 13 is performed in the YBOX 20, and the operation result is transferred to the sense amplifier circuit 14. When the data received by the sense amplifier circuit 14 is the logical value "0", the memory cell transistor MT connected to the sense amplifier circuit 14 is in a state of "writing" and when it is the logical value "1", the memory cell transistor MT is in a state of "non-writing (writing completion)".

The operation in the YBOX 20 is performed as follows. At first, the data bus 16 is controlled to transfer the data of the LDL to the YBOX 20. Next, the data bus 16 is controlled to transfer the data of the UDL to the YBOX 20. Upon receipt of the data of the LDL and the data of the UDL, the YBOX 20 executes the AND operation and transfers the result to the sense amplifier circuit 14. In this operation, the data bus 16 is twice driven. As mentioned above, along with the advance in the writing, the number of the LDLs and the UDLs storing the data "1" is increasing. In other words, the number of the sense amplifier circuits 14 having the data "1" is increasing.

Next, with reference to FIG. 14, the writing operation into the memory cell array of the NAND-type flash memory shown in FIG. 1 will be described. FIG. 14 shows the step indicating the procedure as "ST" in abbreviation. In FIG. 14, the writing data for one page is transferred from the page buffer circuits 13 to the sense amplifier circuits 14 (ST1). The sense amplifier circuits 14 apply each writing pulse voltage to the respective memory cell transistors MT through the corresponding word lines WL, where the writing data for one page received from the page buffer circuits 13 is written at each data level (ST2).

Upon completion of the writing by the sense amplifier circuit 14, each YBOX 20 verifies that each level data A, B, and C has been written (ST3 to ST5), and checks whether there is a fail bit which has not been written yet, of the respective level data A, B, and C, by collating with the stored data of the corresponding LDLs and UDLs (ST6). As the result, when there is a fail bit (ST6: Yes), the writing pulse voltage is raised up to a voltage necessary for writing the corresponding level data (ST7), and the processing ST1 to ST6 will be repeated until there is no fail bit (ST6: No). In the repetition process, when there is no fail bit (ST6: No), the writing control operation is finished at that point.

Here, the data bus 16 is driven at the data transfer to the sense amplifier circuit 14 in ST1 and at the data operation in each verify process in ST3 to ST5. Actually, the number of the loops of the writing control operation shown in FIG. 14 exceeds ten. Since the driving of the data bus 16 happens at the same time, the number of the happenings much effects on the amount of the current consumption in the data bus 16.

In this respect, the LDLs and the UDLs included in the data latch circuit of the comparative example shown in FIG. 6 require a large number of the charge and discharge times of the data bus 16, hence to increase the current consumption. On the contrary, in the embodiment, since the LDL and the UDL are formed as shown by the data latch circuit in FIG. 5, the number of the charge and discharge times at the data bus driving can be reduced and the current consumption can be reduced. Hereinafter, this will be described in detail.

Assuming that the LDL and the UDL in the data latch circuit of the comparative example shown in FIG. 6 have random writing data in the initial states, the number of the data having the logical value "1" is almost the same as the number of the data having the logical value "0", and the data bus charge and discharge times at the operation of the LDL and UDL shown in FIG. 12A happen for the number of the data latch circuits (LDL, UDL) storing the data "1" at the node a. This is half the whole number.

In the process of the writing, when the stored data of the node a is turned to the logical value "1" and the stored data of the node b is turned to the logical value "0", the number of the data bus charge and discharge times at the operation of LDL&UDL is increasing. In a final stage of the writing, since each stored data of each node a in all the data latch circuits (LDL, UDL) is changed to the logical value "1", the data bus charge and discharge at the operation of LDL&UDL happens in almost all the data latch circuits (LDL, UDL) and the charge and discharge current of the data bus is increasing along with the advance in the writing.

Also in the LDL and the UDL formed by the data latch circuit shown in FIG. 5, the number of the data having the logical value "1" is almost the same as the number of the data having the logical value "0" in the initial states; therefore, there is no difference in the number of the data bus charge and discharge times between this and that one as shown by the data latch circuit of the comparative example in FIG. 6.

The LDL and the UDL formed by the data latch circuit shown in FIG. 5 can output the stored data to the data bus 16 also from the node a in the data transfer from the LDL or the UDL to the YBOX 20.

Therefore, in the LDL and the UDL formed by the data latch circuit shown in FIG. 5, when each stored data of each node a is turned to the logical value "1", in the process of the writing, the number of the times of discharging the data bus 16 is decreasing, on the contrary to that one formed by the data latch circuit of the comparative example shown in FIG. 6, and in a final stage of the writing, when each stored data of each node a in all the data latch circuits (LDL, UDL) is turned to the logical value "1", the number of the times of discharging the data bus 16 almost gets zero. In short, in the process of the writing, the charge and discharge current of the data bus 16 is decreasing.

Assuming that the writing proceeds evenly, the current consumption in the data bus transfer by the LDL and the UDL formed by the data latch circuit of the comparative example shown in FIG. 6 is about three times larger than the current consumption in the data bus transfer by the LDL and the UDL formed by the data latch circuit shown in FIG. 5.

Taking the above into consideration, it is possible to reduce the current consumption in the data bus transfer, by monitoring the state of the stored data in the LDL and the UDL formed by the data latch circuit shown in FIG. 5 in the process of latching data; by controlling to output the stored data from the node a to the data bus 16 when the number of the data latch circuits (LDL, UDL) having the logical value "1" as for the stored data of the node a is larger; and by controlling to output the stored data from the node b to the data bus 16 when the number of the data latch circuits (LDL, UDL) having the logical value "0" as for the stored data of the node a is larger.

As mentioned above, the embodiment can realize a non-volatile semiconductor memory device including a robust data latch circuit, free from erroneous inversion of stored data, capable of transferring data to the sense amplifier circuit with a low current consumption, even with a further advance in miniaturization.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a nonvolatile memory cell array;
    a sense amplifier circuit that controls a data writing operation and a data reading operation to and from the nonvolatile memory cell array; and
    a data latch circuit, connected to the sense amplifier circuit through a data bus, that outputs stored data to the data bus when the sense amplifier circuit performs the data writing, wherein
    the data latch circuit has two nodes respectively storing and outputting normal data and inverted data, which are connected to the data bus in common, wherein
    the data latch circuit is controlled to output the stored data of one node or the stored data of the other node to the data bus, according to a polarity of the data stored by one of the two nodes.

2. The nonvolatile semiconductor memory device according to claim 1, wherein
    the data latch circuit is such that the two nodes are connected to the data bus respectively through NMOS transistors only.

3. The nonvolatile semiconductor memory device according to claim 2, wherein
    the data latch circuit is controlled to output the stored data of one node or the stored data of the other node to the data bus, according to a polarity of the data stored by one of the two nodes.

4. The nonvolatile semiconductor memory device according to claim 1, wherein
    the data latch circuit is controlled to output the stored data of one node or the stored data of the other node to the data bus, according to a polarity of the data stored by one of the two nodes, and the stored data to output to the data bus is selected from a node storing the data, of the polarity having the less number of times of discharge at driving the data bus.

5. The nonvolatile semiconductor memory device according to claim 1, wherein
    the data latch circuit includes two CMOS inverter circuits which form the two nodes by connecting each input terminal and each output terminal in a cross way, and two NMOS transistors which are respectively provided between one of the two input/output terminals connected in a cross way and the data bus and between the other thereof and the data bus, and
    in the two CMOS inverter circuits, respective source terminals of the respective NMOS transistors arranged on a ground side are directly connected to the ground, and respective source terminals of respective PMOS transistors arranged on a power side are directly connected to power sources.

6. The nonvolatile semiconductor memory device according to claim 2, wherein
the data latch circuit includes two CMOS inverter circuits which form the two nodes by connecting each input terminal and each output terminal in a cross way, and two NMOS transistors which are respectively provided between one of the two input/output terminals connected in a cross way and the data bus and between the other thereof and the data bus, and
in the two CMOS inverter circuits, respective source terminals of the respective NMOS transistors arranged on a ground side are directly connected to the ground, and respective source terminals of respective PMOS transistors arranged on a power side are directly connected to power sources.

7. The nonvolatile semiconductor memory device according to claim 4, wherein
the data latch circuit includes two CMOS inverter circuits which form the two nodes by connecting each input terminal and each output terminal in a cross way, and two NMOS transistors which are respectively provided between one of the two input/output terminals connected in a cross way and the data bus and between the other thereof and the data bus, and
in the two CMOS inverter circuits respective source terminals of the respective NMOS transistors arranged on a ground side are directly connected to the ground, and respective source terminals of respective PMOS transistors arranged on a power side are directly connected to power sources.

8. The nonvolatile semiconductor memory device according to claim 1, wherein
the data latch circuit includes two CMOS inverter circuits which form the two nodes by connecting each input terminal and each output terminal in a cross way, and two NMOS transistors which are respectively provided between one of the two input/output terminals connected in a cross way and the data bus and between the other thereof and the data bus, and
in the two CMOS inverter circuits, respective source terminals of the respective NMOS transistors arranged on a ground side are directly connected to the ground, and respective source terminals of respective PMOS transistors arranged on a power side are connected to power sources through respective PMOS transistors controlled on/off.

9. The nonvolatile semiconductor memory device according to claim 2, wherein
the data latch circuit includes two CMOS inverter circuits which form the two nodes by connecting each input terminal and each output terminal in a cross way, and two NMOS transistors which are respectively provided between one of the two input/output terminals connected in a cross way and the data bus and between the other thereof and the data bus, and
in the two CMOS inverter circuits, respective source terminals of the respective NMOS transistors arranged on a ground side are directly connected to the ground, and respective source terminals of respective PMOS transistors arranged on a power side are connected to power sources through respective PMOS transistors controlled on/off.

10. The nonvolatile semiconductor memory device according to claim 4, wherein
the data latch circuit includes two CMOS inverter circuits which form the two nodes by connecting each input terminal and each output terminal in a cross way, and two NMOS transistors which are respectively provided between one of the two input/output terminals connected in a cross way and the data bus and between the other thereof and the data bus, and
in the two CMOS inverter circuits, respective source terminals of the respective NMOS transistors arranged on a ground side are directly connected to the ground, and respective source terminals of respective PMOS transistors arranged on a power side are connected to power sources through respective PMOS transistors controlled on/off.

11. The nonvolatile semiconductor memory device according to claim 1, wherein
the nonvolatile memory cell array is formed by a plurality of NAND strings capable of storing a plurality of bits in every memory cell, and
the data latch circuits are respectively provided for the plurality of bits in a one-to-one correspondence and a plurality of the data latch circuits are connected to the data bus in parallel for every corresponding bits.

12. The nonvolatile semiconductor memory device according to claim 2, wherein
the nonvolatile memory cell array is formed by a plurality of NAND strings capable of storing a plurality of bits in every memory cell, and
the data latch circuits are respectively provided for the plurality of bits in a one-to-one correspondence and a plurality of the data latch circuits are connected to the data bus in parallel for every corresponding bits.

13. The nonvolatile semiconductor memory device according to claim 4, wherein
the nonvolatile memory cell array is formed by a plurality of NAND strings capable of storing a plurality of bits in every memory cell, and
the data latch circuits are respectively provided for the plurality of bits in a one-to-one correspondence and a plurality of the data latch circuits are connected to the data bus in parallel for every corresponding bits.

14. The nonvolatile semiconductor memory device according to claim 1, wherein
one end of the data bus is connected to the sense amplifier circuit through a transfer control circuit and the other end is connected to an I/O bus through an I/O buffer, the data bus connecting in parallel for every corresponding bits a plurality of the data latch circuits which are respectively provided for a plurality of bits to be stored in every memory cell of the nonvolatile memory cell array in a one-to-one correspondence, and
the transfer control circuit
divides write data output from the I/O buffer to the data bus into the corresponding data latch circuits and temporarily stores therein, performs a logical operation on the respectively stored data of the data latch circuits having different bits, and transfers the operation data to the sense amplifier, and
divides read data received from the sense amplifier circuit through the data bus into the corresponding data latch circuits and temporarily stores therein, and transfers the stored data to the I/O buffer through the data bus.

15. The nonvolatile semiconductor memory device according to claim 12, wherein
one end of the data bus is connected to the sense amplifier circuit through a transfer control circuit and the other end is connected to an I/O bus through an I/O buffer,
the transfer control circuit
divides write data output from the I/O buffer to the data bus into the corresponding data latch circuits and temporarily stores therein, performs a logical operation on the respectively stored data of the data latch circuits having different bits, and transfers the operation data to the sense amplifier, and divides read data received from the sense amplifier circuit through the data bus into the corresponding data latch circuits and temporarily stores therein, and transfers the stored data to the I/O buffer through the data bus.

16. The nonvolatile semiconductor memory device according to claim 13, wherein
one end of the data bus is connected to the sense amplifier circuit through a transfer control circuit and the other end is connected to an I/O bus through an I/O buffer,
the transfer control circuit
divides write data output from the I/O buffer to the data bus into the corresponding data latch circuits and temporarily stores therein, performs a logical operation on the respectively stored data of the data latch circuits having different bits, and transfers the operation data to the sense amplifier, and
divides read data received from the sense amplifier circuit through the data bus into the corresponding data latch circuits and temporarily stores therein, and transfers the stored data to the I/O buffer through the data bus.

17. The nonvolatile semiconductor memory device according to claim 1, wherein
in two adjacent bit lines, one of the sense amplifier circuits is arranged on one side of the bit lines and the other is arranged on the other side of the bit lines.

* * * * *